(12) United States Patent
Robin

(10) Patent No.: US 11,837,780 B2
(45) Date of Patent: Dec. 5, 2023

(54) RADIOFREQUENCY SIGNAL CONTROL DEVICE OF A DOMESTIC ELECTRICAL APPARATUS, AND ASSOCIATED DOMESTIC ELECTRICAL APPARATUS AND BLANKING DEVICE

(71) Applicant: SOMFY ACTIVITES SA, Cluses (FR)

(72) Inventor: Serge Robin, Cluses (FR)

(73) Assignee: SOMFY ACTIVITES SA, Cluses (FR)

( * ) Notice: Subject to any disclaimer, the term of this patent is extended or adjusted under 35 U.S.C. 154(b) by 0 days.

(21) Appl. No.: 18/245,912

(22) PCT Filed: Sep. 28, 2021

(86) PCT No.: PCT/EP2021/076704
§ 371 (c)(1),
(2) Date: Mar. 20, 2023

(87) PCT Pub. No.: WO2022/069494
PCT Pub. Date: Apr. 7, 2022

(65) Prior Publication Data
US 2023/0307824 A1    Sep. 28, 2023

(30) Foreign Application Priority Data
Sep. 29, 2020   (FR) ..................................... 2009905

(51) Int. Cl.
*H04B 1/18* (2006.01)
*H01Q 1/38* (2006.01)
(Continued)

(52) U.S. Cl.
CPC ................. *H01Q 1/38* (2013.01); *H01Q 1/48* (2013.01); *H05K 1/147* (2013.01)

(58) Field of Classification Search
CPC .. H04B 1/005; H04B 1/18; H01Q 1/241–243; H01Q 1/38–50
See application file for complete search history.

(56) References Cited

U.S. PATENT DOCUMENTS 9,859,933 B2   1/2018   Ramus
10,666,301 B2   5/2020   Ramus et al.
(Continued)

FOREIGN PATENT DOCUMENTS

FR   3028693 A1   5/2016
FR   3061340 A1   6/2018

OTHER PUBLICATIONS

Search Report for French Application No. 2009905 dated Jun. 4, 2021.

(Continued)

*Primary Examiner* — Hasan Islam
(74) *Attorney, Agent, or Firm* — Pearne & Gordon LLP

(57) ABSTRACT

A radiofrequency signal control device of a domestic electrical apparatus, configured to be supplied with electrical energy by a mains electrical supply network, comprises a first electrical conductor, a second electrical conductor, a radiofrequency unit, a printed circuit board and an antenna. A first end of each of the first and second electrical conductors is configured to be electrically connected to the mains electrical supply network. The radiofrequency unit is electrically connected to a connection point. The connection point is arranged at a second end of the first electrical conductor. The radiofrequency signal control device further comprises an adaptation line section. A first end of the adaptation line section is electrically connected to the connection point. Furthermore, a second end of the adaptation line section is either electrically connected to a reference voltage or is devoid of an electrical connection.

13 Claims, 7 Drawing Sheets

(51) Int. Cl.
  *H05K 1/14* (2006.01)
  *H01Q 1/48* (2006.01)

(56) References Cited

U.S. PATENT DOCUMENTS

2017/0310351 A1* 10/2017 Ramus ................. H04B 1/0458
2021/0396824 A1* 12/2021 Wang ..................... H03F 3/195

OTHER PUBLICATIONS

Search Report for International Application No. PCT/EP2021/076704 dated Dec. 6, 2021.

* cited by examiner

RADIOFREQUENCY SIGNAL CONTROL DEVICE OF A DOMESTIC ELECTRICAL APPARATUS, AND ASSOCIATED DOMESTIC ELECTRICAL APPARATUS AND BLANKING DEVICE

CROSS-REFERENCE TO RELATED APPLICATIONS

This is a National Stage application of PCT international application PCT/EP2021/076704, filed on Sep. 28, 2021, which claims priority from French Patent Application No. 2009905, filed on Sep. 29, 2020, both which are incorporated herein by reference in their entirety.

The present invention relates to a radiofrequency signal control device of a domestic electrical apparatus, in other words a control device for a domestic electrical apparatus. The domestic electrical apparatus is configured to be supplied with electrical energy from a mains electrical supply network.

The present invention also relates to a domestic electrical apparatus comprising such a radiofrequency signal control device, and to an occultation device comprising such a domestic electrical apparatus. The domestic electrical apparatus can be an electromechanical actuator for an occultation device, in other words an electromechanical actuator of an occultation device.

In general, the present invention relates to the field of occultation devices comprising a motorised drive device moving a screen, between at least a first position and at least a second position.

A motorised drive device comprises an electromechanical actuator of a movable closure, occultation or sun protection element such as a shutter, door, gate, blind or any other equivalent equipment, hereinafter referred to as a screen.

The domestic electrical apparatus can also be an electrical power supply module for a lighting device, a heating and/or ventilation device, an alarm device or an occultation device, in other words an electrical power supply module of a lighting device, a heating and/or ventilation device, an alarm device or an occultation device.

FR 3 028 693 A1 is already known, which describes a radiofrequency signal control device of a domestic electrical apparatus. The domestic electrical apparatus is configured to be supplied with electrical energy from a mains electrical supply network. The radiofrequency signal control device comprises a first electrical conductor, a second electrical conductor, a radiofrequency unit, a printed circuit board, an antenna. Each of the first and second electrical conductors comprises a first end and a second end. The first end of each of the first and second electrical conductors is configured to be electrically connected to the mains electrical supply network. The radiofrequency unit is configured to receive and/or emit radiofrequency signals. The radiofrequency unit comprises an input and/or an output for radiofrequency signals. The radiofrequency unit is electrically connected to a connection point. The printed circuit board comprises the first and second electrical conductors and the connection point. The antenna is electrically connected to the radiofrequency unit by at least one of the electrical conductors of the mains electrical supply network.

This document also describes that the radiofrequency signal control device further comprises a coupler. The printed circuit board also comprises the coupler. Moreover, the connection point is an integral part of the coupler and is arranged between its first and second ends. The coupler is configured to adapt the output and/or input impedance of the radiofrequency unit to the impedance of the antenna. The coupler is formed by a transport line printed on the printed circuit board. A first end of the printed transport line is electrically connected to the first electrical conductor. Furthermore, a second end of the printed transport line is electrically connected to a reference voltage and to the radiofrequency unit. This radiofrequency signal control device is generally satisfactory.

However, the disadvantage of this radiofrequency signal control device is that the coupler is arranged between the first electrical conductor and the radiofrequency unit.

Thus, such an arrangement of the coupler on the printed circuit board causes a clutter on the printed circuit board, in particular in a longitudinal direction, which hinders the reduction of the size of the printed circuit board.

Therefore, the location of the coupler on the printed circuit board prevents the printed circuit board from being reduced in size, requires a large housing in the domestic electrical apparatus for the assembly of the printed circuit board and the cost of obtaining the printed circuit board of the radiofrequency signal control device remains expensive.

Furthermore, such a coupler on the printed circuit board causes radiofrequency losses, in terms of power and sensitivity, when receiving and/or emitting the radiofrequency signals by the radiofrequency signal control device.

Moreover, such a radiofrequency signal control device has the disadvantage that a supply current of the domestic electrical apparatus flows through the coupler formed by the printed transport line.

The present invention aims at solving the aforementioned drawbacks and at providing a radiofrequency signal control device of a domestic electrical apparatus, as well as a domestic electrical apparatus comprising such a radiofrequency signal control device and an occultation device comprising such a domestic electrical apparatus, making it possible to adapt an impedance on the first electrical conductor of the radiofrequency signal control device with respect to an impedance of an antenna of the radiofrequency signal control device, to prevent a rejection of the radiofrequency signals between the first electrical conductor and a second electrical conductor of the radiofrequency signal control device, to reduce radiofrequency losses, in terms of power and sensitivity, when receiving and/or emitting the radiofrequency signals by the radiofrequency signal control device, while reducing the dimensions of a printed circuit board.

In this regard, the present invention relates, according to a first aspect, to a radiofrequency signal control device of a domestic electrical apparatus, the domestic electrical apparatus being configured to be supplied with electrical energy from a mains electrical supply network, the radiofrequency signal control device comprising at least:
  a first electrical conductor and a second electrical conductor, each of the first and second electrical conductors comprising a first end and a second end, the first end of each of the first and second electrical conductors being configured to be electrically connected to the mains electrical supply network,
  a radiofrequency unit, the radiofrequency unit being configured to emit and/or receive radiofrequency signals, the radiofrequency unit comprising an input and/or an output of the radiofrequency signals, the radiofrequency unit being electrically connected to a connection point,
  a printed circuit board, the printed circuit board comprising at least the connection point, and an antenna, the antenna being electrically connected to the radiofrequency unit by at least one of the electrical conductors of the mains electrical supply network.

According to the invention, the connection point is arranged at the second end of the first electrical conductor. The radiofrequency signal control device further comprises at least one adaptation line section, the adaptation line section comprising a first end and a second end, the first end of the adaptation line section being electrically connected to the connection point and the second end of the adaptation line section being either electrically connected to a reference voltage or is devoid of an electrical connection.

Thus, the adaptation line section electrically connected to the connection point arranged at the second end of the first electrical conductor allows to adapt an impedance on the first electrical conductor with respect to an impedance of the antenna, to prevent a rejection of the radiofrequency signals between the first and second electrical conductors of the radiofrequency signal control device, to reduce radiofrequency losses, in terms of power and sensitivity, when receiving and/or emitting the radiofrequency signals by the radiofrequency signal control device, while reducing the dimensions of the printed circuit board.

In this way, such a radiofrequency signal control device makes it possible to dispense with a coupler.

According to an advantageous feature of the invention, the first adaptation line section is an electrical track of the printed circuit board.

According to another advantageous feature of the invention, the first adaptation line section has a length close to a quarter of the wavelength of the working frequency of the radiofrequency unit.

According to another advantageous feature of the invention, the radiofrequency signal control device further comprises another adaptation line section and another connection point. The other connection point is arranged at the second end of the second electrical conductor. The other adaptation line section comprises a first end and a second end. The first end of the other adaptation line section is electrically connected to the other connection point. Furthermore, the second end of the other adaptation line section either is devoid of an electrical connection or is electrically connected to a reference voltage.

According to another advantageous feature of the invention, the radiofrequency signal control device further comprises an adaptation circuit and another connection point. The other connection point is arranged at the second end of the second electrical conductor. Furthermore, the adaptation circuit is electrically connected, on the one hand, to the other connection point and, on the other hand, is either electrically connected to a reference voltage or to the first electrical conductor.

According to another advantageous feature of the invention, the radiofrequency signal control device further comprises at least one radiofrequency signal transport line. The transport line comprises a first end and a second end. The first end of the transport line is electrically connected to the first electrical conductor. Furthermore, the second end of the transport line is electrically connected to the radiofrequency unit.

According to another advantageous feature of the invention, the first end of the transport line is electrically connected to the connection point, the connection point being configured to be electrically connected to the radiofrequency unit.

According to another advantageous feature of the invention, the printed circuit board carries the transport line.

Furthermore, the transport line is formed by an electrical track printed on the printed circuit board.

According to another advantageous feature of the invention, the radiofrequency signal control device is devoid of a coupler arranged between the first electrical conductor and the radiofrequency unit.

The present invention relates, according to a second aspect, to a domestic electrical apparatus. The domestic electrical apparatus comprises at least a radiofrequency signal control device according to the invention and as mentioned above.

This domestic electrical apparatus has similar features and advantages to those described above, in relation to the radiofrequency signal control device according to the invention.

According to an advantageous feature of the invention, the domestic electrical apparatus is an electromechanical actuator for an occultation device.

In a variant, the domestic electrical apparatus is an electrical power supply module, the electrical power supply module being intended to be housed within an electrical wall or ceiling box and being configured to supply electrical energy to a lighting device, a heating and/or ventilation device, an alarm device or an occultation device.

The present invention relates, according to a third aspect, to an occultation device. The occultation device comprises at least an electromechanical actuator formed by a domestic electrical apparatus according to the invention and as mentioned above.

This occultation device has similar features and advantages to those described above, in relation to the domestic electrical apparatus according to the invention and to the radiofrequency signal control device according to the invention.

Further features and advantages of the invention will become apparent in the following description.

In the attached drawings, given as non-limiting examples:

Figure 1:
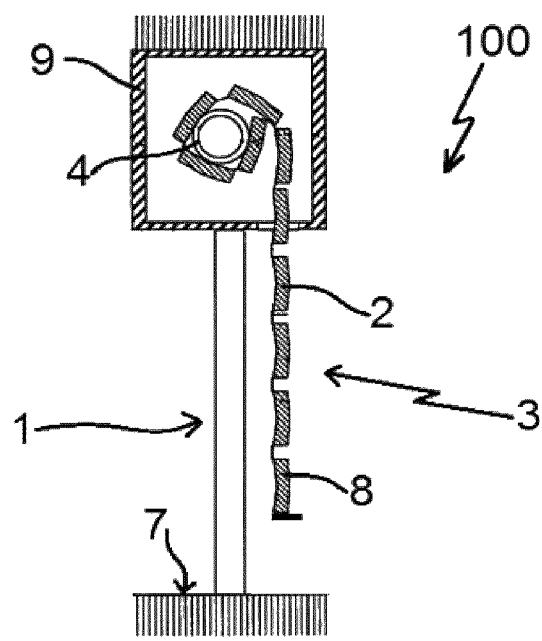
FIG. 1 is a schematic transverse cross-section view of an installation comprising an occultation device according to a first embodiment of the invention.
Figure 2:
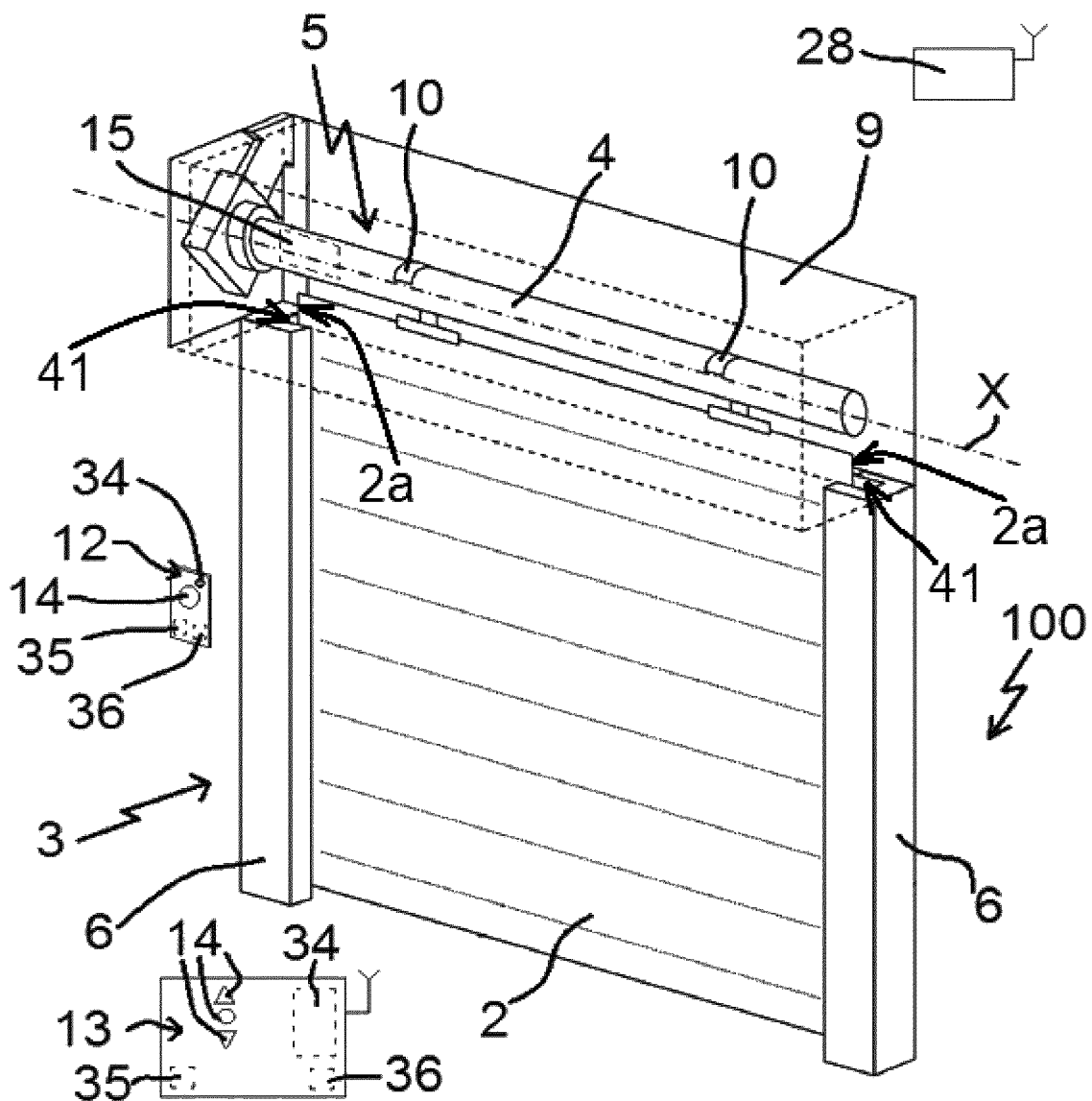
FIG. 2 is a schematic perspective view of the installation illustrated in FIG. 1.

Firstly, with reference to FIGS. 1 and 2, an installation 100 comprising a closing, occultation or sun protection device 3 according to a first embodiment of the invention is described. This installation 100, installed in a building, not shown, with an opening 1, window or door, is equipped with a screen 2 belonging to the closing, occultation or sun protection device 3, in particular a motorised roller shutter.

The closing, occultation or sun protection device 3 is hereinafter referred to as "occultation device". The occultation device 3 comprises the screen 2.

The closing, occultation or sun protection device 3 can be a roller shutter, a canvas blind or a blind with adjustable slats, or a roller gate. The present invention is applicable to all types of occultation devices.

Here, the installation 100 comprises the occultation device 3.

With reference to FIGS. 1 and 2, a roller shutter according to the first embodiment of the invention is described.

The occultation device 3 comprises a winding tube 4 and a motorised drive device 5. The motorised drive device 5 comprises an electromechanical actuator 11 illustrated in FIG. 3.

The screen 2 is configured to be moved, in other words is moved, by means of the motorised drive device 5.

Here, the screen 2 of the occultation device 3 is rolled onto the winding tube 4 driven by the motorised drive device 5. Thus, the screen 2 can be moved between a rolled position, in particular a high position, and an unrolled position, in particular a low position. In other words, the screen 2 can be rolled onto the winding tube 4. Furthermore, the winding tube 4 is arranged to be rotated by the electromechanical actuator 11.

The occultation device 3 comprises a box 9.

The screen 2 is arranged, in other words is configured to be arranged, at least partially within the box 9, in an assembled configuration of the occultation device 3.

The screen 2 of the occultation device 3 is a closing, occultation, and/or sun protection screen, which can be wound and unwound around the winding tube 4, the inner diameter of which is greater than the outer diameter of the electromechanical actuator 11, so that the electromechanical actuator 11 can be inserted into the winding tube 4, when the occultation device 3 is assembled.

The motorised drive device 5 comprises the electromechanical actuator 11, in particular one that is tubular.

This allows the winding tube 4 to be rotated about an axis of rotation X, so that the screen 2 of the occultation device 3 can be moved, in particular unrolled or rolled.

Thus, the screen 2 can be rolled and unrolled on the winding tube 4. In the installed state, the electromechanical actuator 11 is inserted into the winding tube 4.

Advantageously, the occultation device 3 further comprises two lateral slides 6. Each lateral slide 6 comprises a groove 41. Each groove 41 of one of the lateral slides 6 cooperates, in other words is configured to cooperate, with a lateral edge 2a of the screen 2, in the assembled configuration of the occultation device 3, so as to guide the screen 2, during the movement, in particular the rolling and unrolling, of the screen 2, in particular around the winding tube 4.

In a known way, the roller shutter, which forms the occultation device 3, comprises a curtain comprising horizontal slats articulated to each other, forming the screen 2 of the roller shutter 3, and guided by the two lateral slides 6. These slats are joined together when the curtain 2 of the roller shutter 3 reaches its lower unrolled position.

In the case of a roller shutter, the upper rolled position corresponds to a final end slat 8, for example in the shape of an L, of the curtain 2 of the roller shutter 3 coming to rest against an edge of the box 9 of the roller shutter 3 or to the final end slat 8 coming to rest in a programmed upper end-of-travel position. Furthermore, the lower unrolled position corresponds to the final end slat 8 of the curtain 2 of the roller shutter 3 coming to rest against a threshold 7 of the opening 1 or to the final end slat 8 being stopped in a programmed lower end-of-travel position.

The first slat of the roller shutter 3, opposite the final end slat 8, is connected to the winding tube 4 by means of at least one joint 10, in particular a strip-shaped attachment piece.

The winding tube 4 is arranged inside the box 9 of the roller shutter 3. The curtain 2 of the roller shutter 3 rolls up and rolls down around the winding tube 4 and is housed at least partly inside the box 9.

In general, the box 9 is arranged above the opening 1, or at the upper part of the opening 1.

The motorised drive device 5 is controlled by a command unit. The command unit can be, for example, a local command unit 12.

The local command unit 12 can be connected to a central command unit 13 by a wired or wireless connection. The central command unit 13 controls the local command unit 12, and other similar local command units distributed throughout the building.

The motorised drive device 5 is, preferably, configured to execute the commands for moving, in particular for unrolling or rolling, the screen 2 of the occultation device 3, which can be emitted, especially, by the local command unit 12 or the central command unit 13.

The installation 100 comprises the local command unit 12, or the central command unit 13, or both the local command unit 12 and the central command unit 13.

The motorised drive device 5, including the electromechanical actuator 11, belonging to the installation 100 of FIGS. 1 and 2 is now described in more detail with reference to FIG. 3.

The electromechanical actuator 11 comprises an electric motor 16.

Advantageously, the electric motor 16 comprises a rotor and a stator, not shown and positioned coaxially around the axis of rotation X, which is also the axis of rotation of the winding tube 4 in the mounted configuration of the motorised drive device 5.

Means for controlling the electromechanical actuator 11, allowing the movement of the screen 2 of the occultation device 3, are constituted by at least one electronic control unit 15. This electronic control unit 15 belongs to the electromechanical actuator 11 and is able to turn on the electric motor 16 of the electromechanical actuator 11 and, in particular, to enable the supply of electrical energy to the electric motor 16.

Thus, the electronic control unit 15 controls, especially, the electric motor 16, so as to open or close the screen 2, as described previously.

The means of controlling the electromechanical actuator 11 comprise hardware and/or software means.

Figure 3:
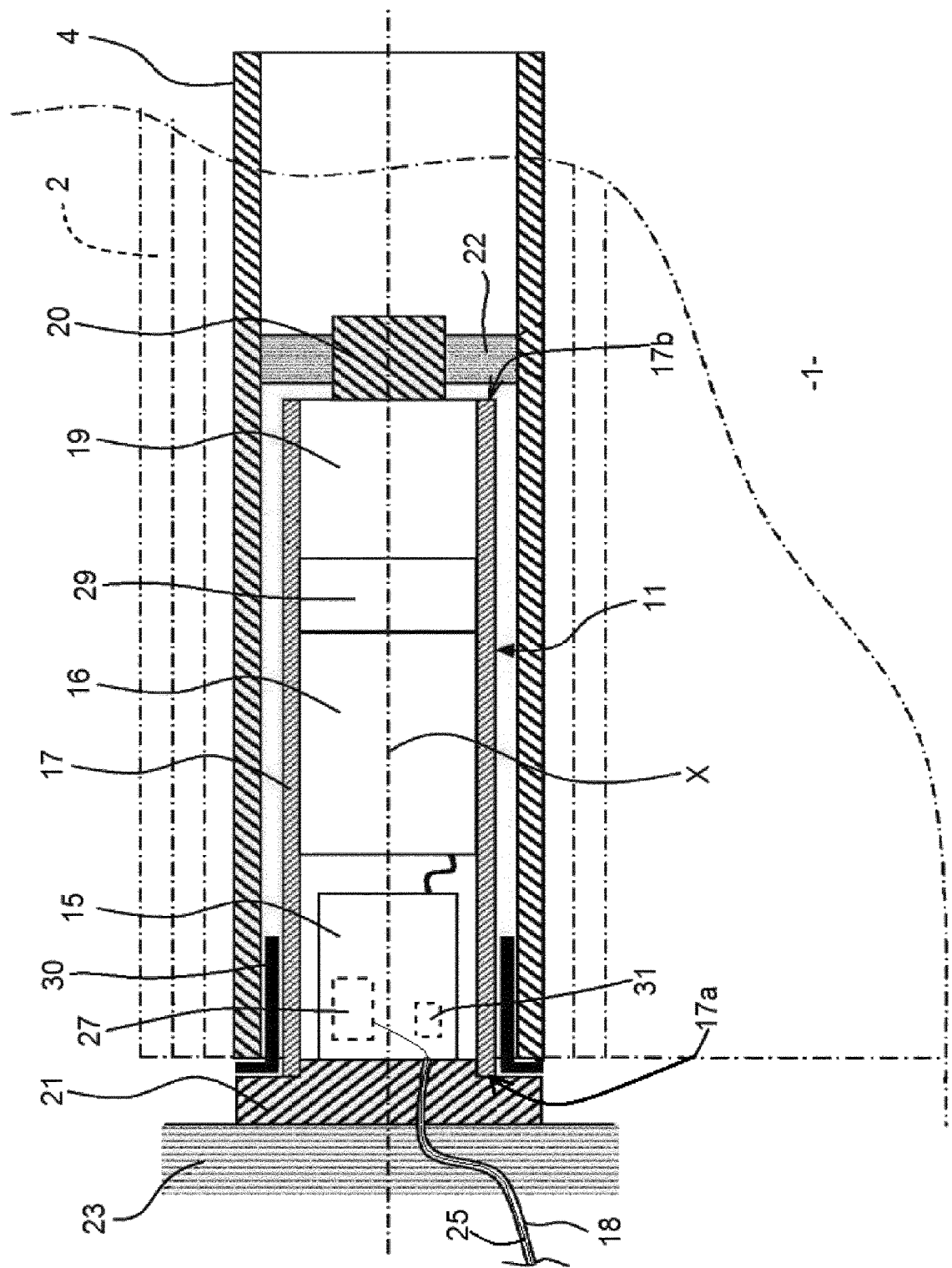
FIG. 3 is a schematic partial and axial cross-section view of the installation illustrated in FIGS. 1 and 2, showing an electromechanical actuator of the installation.

As a non-limiting example, the hardware means can comprise at least one microcontroller 31, shown in FIG. 3.

The motorised drive device 5 comprises the electronic control unit 15. The electronic control unit 15 is electrically connected to the electric motor 16. The electronic control unit 15 is arranged inside the box 9, in the assembled configuration of the occultation device 3.

The electronic control unit 15 further comprises a first communication module 27, as illustrated in FIG. 3, in particular for receiving command orders, the command orders being emitted by an order emitter, such as the local command unit 12 or the central command unit 13, these orders being intended to control the motorised drive device 5.

The first communication module 27 of the electronic control unit 15 is wireless. The first communication module 27 is configured to receive radio command orders.

The motorised drive device 5 comprises a antenna 25, called radioelectric. The antenna 25 is electrically connected to the electronic control unit 15 and, more particularly, to the first communication module 27.

Advantageously, the first communication module 27 can also allow the reception of command orders emitted by wired means.

The electronic control unit 15, the local command unit 12 and/or the central command unit 13 can be in communication with a weather station deported to the outside of the building, including, especially, one or more sensors that can be configured to determine, for example, temperature, brightness, or wind speed.

The electronic control unit 15, the local command unit 12 and/or the central command unit 13 can also be in communication with a server 28, so as to control the electromechanical actuator 11 according to data made available remotely by a communication network, in particular an Internet network that can be connected to the server 28.

The electronic control unit 15 can be controlled from the local command unit 12 and/or central command unit 13. The local command unit 12 and/or central command unit 13 is provided with a control keyboard. The control keyboard of the local 12 or central 13 command unit comprises one or more selection elements 14 and, eventually, one or more display elements 34.

As non-limiting examples, the selection elements can be push buttons or touch-sensitive keys, the display elements can be light-emitting diodes, an LCD (Liquid Crystal Display) or TFT (Thin Film Transistor) display. The selection and display elements can also be realised by means of a touch screen.

The local 12 and/or central 13 command unit comprises at least a second communication module 36.

Thus, the second communication module 36 of the local 12 or central 13 command unit is configured to emit, in other words emit, command orders, in particular by wireless means, in this case radioelectric, or, eventually, by wired means.

Furthermore, the second communication module 36 of the local 12 or central 13 command unit can also be configured to receive, in other words receives, command orders, in particular by the same means.

The second communication module 36 of the local 12 or central 13 command unit is configured to communicate, in other words communicates, with the first communication module 27 of the electronic control unit 15.

Thus, the second communication module 36 of the local 12 or central 13 command unit exchanges command orders with the first communication module 27 of the electronic control unit 15, either monodirectionally or bidirectionally.

Advantageously, the local command unit 12 is a control point, which can be fixed or mobile. A fixed control point can be a control box to be fixed on a façade of a wall of a building or on a face of a frame of a window or door. A mobile control point can be a remote control, a smartphone or a tablet.

Advantageously, the local 12 and/or central 13 command unit further comprises a controller 35.

The motorised drive device 5, in particular the electronic control unit 15, is, preferably, configured to carry out command orders for controlling the movement, especially closing and opening, of the screen 2 of the occultation device 3. These command orders can be emitted, especially, by the local command unit 12 or by the central command unit 13.

The motorised drive device 5 can be controlled by the user, for example by receiving a command order corresponding to pressing the or one of the selection elements 14 of the local command unit 12 or central command unit 13.

The motorised drive device 5 can also be controlled automatically, for example by receiving a command order corresponding to at least one signal from at least a sensor and/or a signal from a clock of the electronic control unit 15, in particular the microcontroller 31. The sensor and/or the clock can be integrated in the local command unit 12 or in the central command unit 13.

Advantageously, the electromechanical actuator 11 comprises a casing 17, in particular a tubular one. The electric motor 16 is mounted inside the casing 17, in particular in an assembled configuration of the electromechanical actuator 11.

Here, the casing 17 of the electromechanical actuator 11 is cylindrical in shape, in particular rotationally symmetrical about the axis of rotation X.

In an embodiment, the casing 17 is made of a metallic material.

The material of the casing of the electromechanical actuator is not limiting and can be different. In particular, it can be a plastic material.

Advantageously, the electromechanical actuator 11 further comprises a gearbox 19 and an output shaft 20.

Advantageously, the electromechanical actuator 11 further comprises a brake 29.

As a non-limiting example, the brake 29 can be a spring brake, a cam brake, a magnetic brake or an electromagnetic brake.

Here and as seen in FIG. 3, in the assembled configuration of the electromechanical actuator 11, the brake 29 is configured to be arranged, in other words is arranged, between the electric motor 16 and the gearbox 19, that is to say at the output of the electric motor 16.

In a variant, not shown, in the assembled configuration of the electromechanical actuator 11, the brake 29 is configured to be arranged, in other words is arranged, between the electronic control unit 15 and the electric motor 16, in other words at the input of the electric motor 16, between the gearbox 19 and the output shaft 20, in other words at the output of the gearbox 19, or between two reduction stages of the gearbox 19.

Advantageously, the electric motor 16, the brake 29 and the gearbox 19 are configured to be mounted, in other words are mounted, within the casing 17 of the electromechanical actuator 11, in the assembled configuration of the electromechanical actuator 11.

The electromechanical actuator 11 can also comprise an end-of-travel and/or obstacle detection device, not shown, which can be mechanical or electronic.

The winding tube 4 is rotated around the axis of rotation X and the casing 17 of the electromechanical actuator 11 and is supported by two pivot connections. The first pivot connection is made at a first end of the winding tube 4 by means of a ring 30 inserted around a first end 17a of the casing 17 of the electromechanical actuator 11. The ring 30 thus makes it possible to create a bearing. The second pivot connection, not shown in FIG. 3, is made at a second end of the winding tube 4, not visible in this figure.

Advantageously, the electromechanical actuator 11 comprises a torque support 21. The torque support 21 protrudes from the first end 17a of the casing 17 of the electromechanical actuator 11, in particular the end 17a of the casing 17 receiving the ring 30. The torque support 21 of the electromechanical actuator 11 thus allows the electromechanical actuator 11 to be fixed to a frame 23, in particular to a flange of the box 9.

Furthermore, the torque support 21 of the electromechanical actuator 11 can allow the first end 17a of the casing 17 to be shuttered.

Moreover, the torque support 21 of the electromechanical actuator 11 can support the electronic control unit 15. The electronic control unit 15 can be supplied with electrical energy by means of a power supply cable 18.

Here and as illustrated in FIG. 3, the electronic control unit 15 is thereby arranged, in other words is integrated, inside the casing 17 of the electromechanical actuator 11.

In a variant, not shown, the electronic control unit 15 is arranged outside the casing 17 of the electromechanical actuator 11 and, in particular, mounted on the box 9 or in the torque support 21.

Advantageously, the output shaft 20 of the electromechanical actuator 11 is arranged inside the winding tube 4 and at least partly outside the casing 17 of the electromechanical actuator 11.

Advantageously, an end of the output shaft 20 protrudes from the casing 17 of the electromechanical actuator 11, in particular from a second end 17b of the casing 17 opposite the first end 17a.

Advantageously, the output shaft 20 of the electromechanical actuator 11 is configured to rotate a connecting element 22 connected to the winding tube 4. The connecting element 22 is in the form of a wheel.

When the electromechanical actuator 11 is switched on, the electric motor 16 and the gearbox 19 rotate the output shaft 20. Furthermore, the output shaft 20 of the electromechanical actuator 11 rotates the winding tube 4 by the connecting element 22.

Thus, the winding tube 4 rotates the screen 2 of the occultation device 3, so that the opening 1 is opened or closed.

Figure 4:
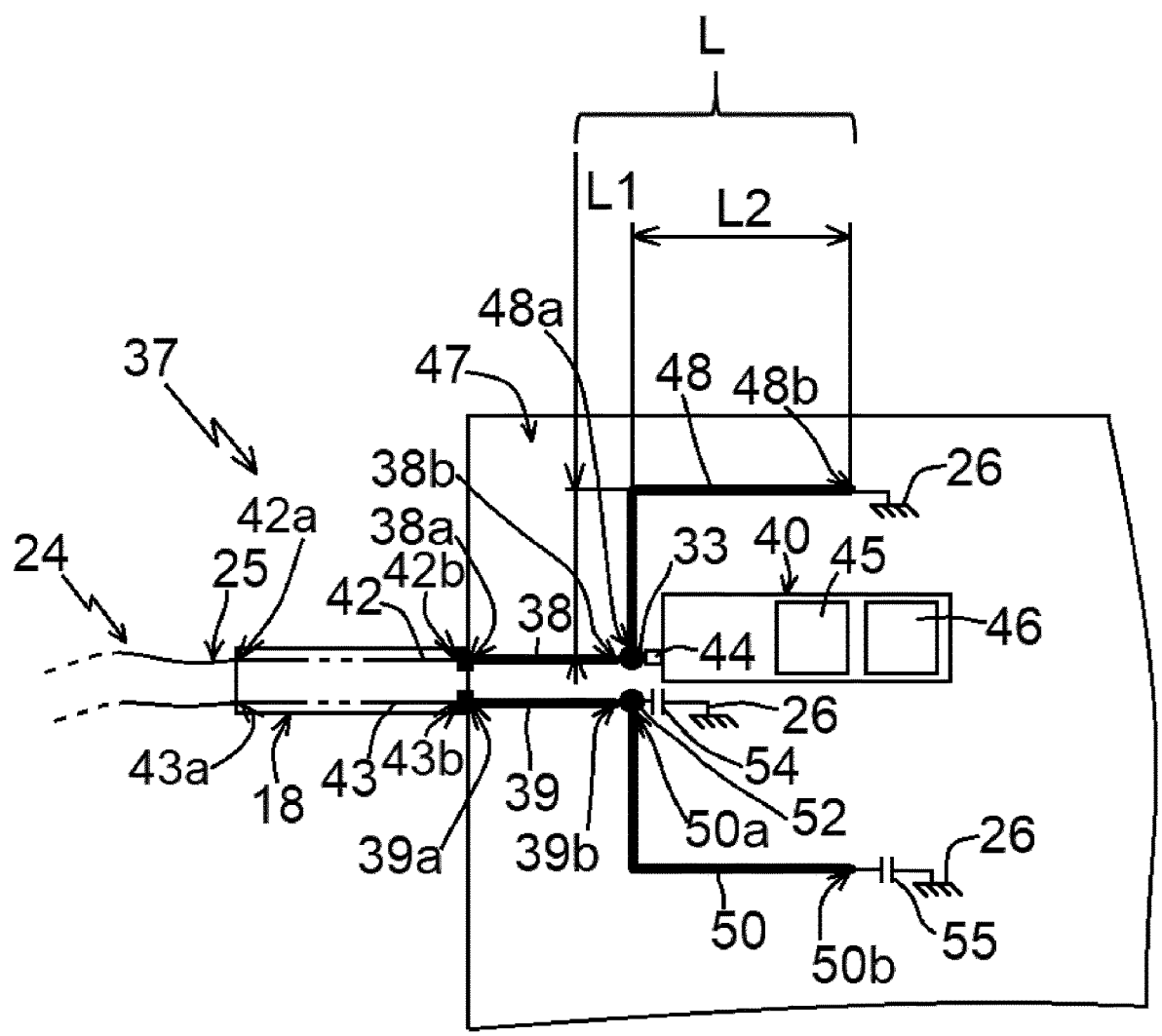
FIG. 4 is a simplified electrical diagram of a radiofrequency signal control device of a domestic electrical apparatus, namely the electromechanical actuator belonging to the installation illustrated in FIGS. 1 to 3, according to the first embodiment.

With reference to FIG. 4, a radiofrequency signal control device 37 of a domestic electrical apparatus is now described.

In an example embodiment, this domestic electrical apparatus is formed by the electromechanical actuator 11, illustrated in FIG. 3, belonging to the installation of FIGS. 1 and 2.

In particular, the electronic control unit 15 of the electromechanical actuator 11, in particular the first communication module 27, comprises part of the radiofrequency signal control device 37.

Thus, the radiofrequency signal control device 37 belongs to the electromechanical actuator 11.

The domestic electrical apparatus is configured to be supplied, in other words is supplied, with electrical energy from a mains electrical supply network 24, through the power supply cable 18.

Here, the current of the mains electrical supply network 24 is of the low frequency AC type, for example on the order of 50 Hz or 60 Hz, the intensity of which can vary according to the mode of operation of the electromechanical actuator 11.

Furthermore, the current of the mains electrical supply network 24 is configured to supply, in other words supplies, to the electromechanical actuator 11 and, in particular, to the electric motor 16 of the electromechanical actuator 11 and the electronic control unit 15.

Here, the radiofrequency signal control device 37 is housed inside the casing 17 of the electromechanical actuator 11. More particularly, the torque support 21 of the electromechanical actuator 11 supports the radiofrequency signal control device 37.

The power supply cable 18 of the electromechanical actuator 11 comprises at least two electrical conductors 42, 43.

Here, the electrical conductor 42 of the power supply cable 18 is hereinafter referred to as first electrical conductor of the power supply cable 18. Furthermore, the electrical conductor 43 of the power supply cable 18 is hereinafter referred to as second electrical conductor of the power supply cable 18.

Each of the first and second electrical conductors 42, 43 of the power supply cable 18 comprises a first end 42a, 43a and a second end 42b, 43b. The first end 42a of the first electrical conductor 42 is distinct from and, in particular, opposite the second end 42b of the first electrical conductor 42. Furthermore, the first end 43a of the second electrical conductor 43 is distinct from and, in particular, opposite the second end 43b of the second electrical conductor 43.

Here, the power supply cable 18 is an integral part of the radiofrequency signal control device 37. In other words, the radiofrequency signal control device 37 comprises the power supply cable 18.

The power supply cable 18 passes through the torque support 21 of the electromechanical actuator 11 at a through opening, not shown, and is electrically connected to the electronic control unit 15.

In an embodiment, the power supply cable 18 is electrically connected to the electronic control unit 15 by fitting an electrical connector of the power supply cable 18 onto an electrical connector of the electronic control unit 15.

In a variant, the power supply cable 18 is electrically connected to the electronic control unit 15 by inserting the first and second electrical conductors 42, 43 of the power supply cable 18 into an electrical connector of the electronic control unit 15.

The radiofrequency signal control device 37 comprises at least a first electrical conductor 38 and a second electrical conductor 39.

Here, the first and second electrical conductors 38, 39 are configured to supply, in other words supply, electrical energy to certain other components of the radiofrequency signal control device 37.

Thus, the first and second electrical conductors 38, 39 of the radiofrequency signal control device 37 are electrically connected to the mains electrical supply network 24 and, in particular, to the first and second electrical conductors 42, 43 of the power supply cable 18.

In this way, the radiofrequency signal control device 37 is supplied with electrical energy from the mains electrical supply network 24.

Advantageously, the first and second electrical conductors 42, 43 of the power supply cable 18 correspond to a phase electrical conductor and a neutral electrical conductor.

Advantageously, the power supply cable 18 can further comprise a protective electrical conductor, not shown. The protective electrical conductor of the power supply cable 18 is connected to earth and to a metal structure of the electromechanical actuator 11, such as, for example, the casing 17 of the electromechanical actuator 11.

Each of the first and second electrical conductors 38, 39 comprises a first end 38a, 39a and a second end 38b, 39b. The first end 38a of the first electrical conductor 38 is distinct from and, in particular, opposite the second end 38b of the first electrical conductor 38. Furthermore, the first end 39a of the second electrical conductor 39 is distinct from and, in particular, opposite the second end 39b of the second electrical conductor 39.

The first end 38a, 39a of each of the first and second electrical conductors 38, 39 is configured to be electrically connected, in other words is electrically connected, to the mains electrical supply network 24, in particular to the electrical conductors of the mains electrical supply network 24 and, more particularly, to the first and second electrical conductors 42, 43 of the power supply cable 18.

The radiofrequency signal control device 37 comprises a radiofrequency unit 40. The radiofrequency unit 40 is configured to receive and/or emit, in other words receive and/or emit, radiofrequency signals, in other words signals carried by radiofrequency waves. The radiofrequency unit 40 comprises an input and/or output 44 of radiofrequency signals, in other words an input, an output or an input and an output. The radiofrequency unit 40 is electrically connected to a connection point 33.

Here, the connection point 33 is hereinafter referred to as first connection point.

Advantageously, radiofrequency signals come from an emitter, not shown, of the local command unit 12 and/or central command unit 13 or a sensor and are emitted to the radiofrequency unit 40. Furthermore, radiofrequency signals come from the radiofrequency unit 40 and are emitted to a receiver, not shown, of the local command unit 12 and/or central command unit 13 or a sensor.

Here, the emitter and, eventually, the receiver of the local command unit 12 and/or central command unit 13 or of a sensor are part of the second communication module 36, illustrated in FIG. 2.

Advantageously, the radiofrequency signals emitted by the local command unit 12 and/or central command unit 13 or by a sensor comprise command orders of the electromechanical actuator 11 or data to be transmitted to the electromechanical actuator 11. Furthermore, the radiofrequency signals emitted by the radiofrequency unit 40 contain data relating to the operation of the electromechanical actuator 11.

Here, the command orders received by the radiofrequency unit 40 are processed by it and transmitted by an electrical connection from the electronic control unit 15 to the electric motor 16, so as to control a movement of the screen 2, either in a first direction of movement, for example up, or in a second direction of movement, for example down, or to stop a movement of the screen 2.

Thus, the radiofrequency signal control device 37 enables bi-directional communication to be implemented, so that command orders or data can be exchanged with the local command unit 12 and/or central command unit 13 or a sensor.

In a variant, the radiofrequency signal control device 37 can only implement one-way communication, so as to receive command orders from the local command unit 12 and/or central command unit 13 or from a sensor.

The radiofrequency signals referred to in the present description are, preferably, of the Hertzian type.

Advantageously, the radiofrequency device 40 further comprises a power supply circuit 45 and a radiofrequency circuit 46.

Advantageously, the power supply circuit 45 of the radiofrequency unit 40 is configured to be supplied, in other words is supplied, with electrical energy by the mains electrical supply network 24 and, in particular, by the first and second electrical conductors 38, 39 of the radiofrequency signal control device 37 electrically connected to the first and second electrical conductors 42, 43 of the power supply cable 18, which is itself connected to the mains electrical supply network 24.

Advantageously, the power supply circuit 45 of the radiofrequency unit 40 comprises elements, not shown, for transforming the voltage of the mains electrical supply network 24 into an internal voltage of the radiofrequency unit 40. Furthermore, the internal voltage of the radiofrequency unit 40 is configured to supply, in other words supplies, electrical energy to the radiofrequency circuit 46 of the radiofrequency unit 40.

As a non-limiting example, the internal voltage of the radiofrequency unit 40 can be on the order of +5V.

Advantageously, the radiofrequency circuit 46 of the radiofrequency unit 40 comprises the elements, not shown, necessary for receiving and/or emitting radiofrequency signals on the input and/or output 44 of radiofrequency signals.

The radiofrequency signal control device 37 further comprises a printed circuit board 47. The printed circuit board 47 comprises at least the first connection point 33.

Here, the printed circuit board 47 is part of the electronic control unit 15.

Here, the printed circuit board 47 carries, in other words comprises, the first and second electrical conductors 38, 39.

Advantageously, the printed circuit board 47 carries, in other words comprises, the radiofrequency unit 40.

Advantageously, the first and second electrical conductors 42, 43 of the power supply cable 18 are electrically connected to electrical tracks on the printed circuit board 47. Furthermore, the first and second electrical conductors 38, 39 of the radiofrequency signal control device 37 are electrical tracks on the printed circuit board 47.

Thus, the first and second electrical conductors 38, 39 of the radiofrequency signal control device 37 are used to supply electrical energy to other components carried on the printed circuit board 47, namely other components of the radiofrequency signal control device 37 and the electronic control unit 15, as well as the electric motor 16 of the electromechanical actuator 11.

The electrical tracks on the printed circuit board 47 correspond to metal strips for creating electrical connections. These electrical tracks are generally provided on a surface of the printed circuit board 47.

The radiofrequency signal control device 37 further comprises the antenna 25. The antenna 25 is electrically connected to the radiofrequency unit 40 by at least one of the electrical conductors of the mains electrical supply network 24 and, eventually, at least one of the first and second electrical conductors 42, 43 of the power supply cable 18.

Advantageously, the antenna 25 comprises, in other words is constituted by, at least one of the first and second electrical conductors 42, 43 of the power supply cable 18 and at least one of the electrical conductors of the mains electrical supply network 24. This antenna 25 is of indeterminate length for radiofrequency signals.

Advantageously, the antenna 25 makes it possible to pick up radiofrequency signals emitted by the emitter of the local command unit 12 and/or central command unit 13 or of a sensor and/or to emit radiofrequency signals towards the receiver of the local command unit 12 and/or central command unit 13 or of a sensor.

The radiofrequency signals are received and/or emitted by the radiofrequency unit 40 and, in particular, by means of the antenna 25 by aerial transmission.

Here, the first connection point 33 is arranged at the second end 38b of the first electrical conductor 38.

The radiofrequency signal control device 37 further comprises at least one adaptation line section 48. The adaptation line section 48 is commonly referred to as stub.

Here, the adaptation line section 48 is hereinafter referred to as first adaptation line section.

The adaptation line section 48 comprises a first end 48a and a second end 48b. The first end 48a is distinct from and, in particular, opposite the second end 48b. The first end 48a of the first adaptation line section 48 is electrically connected to the first connection point 33.

Here, the second end 48b of the first adaptation line section 48 is electrically connected to a reference voltage 26, here to an earth.

In such a case, the first adaptation line section 48 is said to be closed or short-circuited.

In a variant, not shown, the second end 48b of the first adaptation line section 48 is devoid of an electrical connection, in particular to an element of the radiofrequency signal control device 37. The potential of the second end 48b of the first adaptation line section 48 is then said to be "floating".

In such a case, the first adaptation line section 48 is said to be open.

The first adaptation line section 48 electrically connected to the first connection point 33 thus makes it possible to adapt an impedance on the first electrical conductor 38 to an impedance of the antenna 25, to prevent rejection of the radiofrequency signals between the first and second electrical conductors 38, 39 of the radiofrequency signal control device 37, to reduce radiofrequency losses, in terms of power and sensitivity, when receiving and/or emitting radiofrequency signals by the radiofrequency signal control device 37, while reducing the dimensions of the printed circuit board 47.

In this way, the radiofrequency signal control device 37 makes it possible to dispense with a coupler. In other words, the radiofrequency signal control device 37 is devoid of a coupler arranged between the first electrical conductor 38, 42 and the radiofrequency unit 40, which coupler is configured, especially, to adapt an impedance to an impedance of the radiofrequency unit 40.

Furthermore, the first adaptation line section 48 is configured not to be traversed, in other words is not traversed, by the current of the mains electrical supply network 24 circulating in one of the electrical conductors of the mains electrical supply network 24, in the first electrical conductor 42 of the power supply cable 18, then in the first electrical conductor 38 of the radiofrequency signal control device 37.

In this way, the dimensions of the first adaptation line section 48 can be minimised, as well as those of the printed circuit board 47.

Moreover, the first adaptation line section 48 is configured not to be traversed, in other words, is not traversed, by the radiofrequency signals circulating in one of the electrical conductors of the mains electrical supply network 24, in the first electrical conductor 42 of the power supply cable 18, in the first electrical conductor 38 of the radiofrequency signal control device 37, then in the input and/or output 44 of the radiofrequency unit 40.

Advantageously, the dimensions of the first adaptation line section 48 are small, in the case where the working frequency of the radiofrequency unit 40 is higher than 1 GHz, for example of the order of 2.4 GHz.

Advantageously, the first adaptation line section 48 can be inductive or capacitive type.

Advantageously, the first adaptation line section 48 is an electrical track on the printed circuit board 47.

Advantageously, the first adaptation line section 48 enables the radiofrequency signal control device 37 to be operated in a high radiofrequency signal band, which can be higher than 1 GHz, for example in the range of 2.4 GHz.

The track on the printed circuit board 47 forming the first adaptation line section 48 has a length L to adapt the impedance on the first electrical conductor 38 to an impedance of the antenna 25.

Advantageously, the length L of the first adaptation line section 48 is close to a quarter of the wavelength of the working frequency of the radiofrequency unit 40.

Close means that the ratio of the length L to the wavelength of the working frequency of the radiofrequency unit 40 is between 0,5 and 1,5, preferably between 0,8 and 1,2, more preferably between 0,9 and 1,1.

Advantageously, the first adaptation line section 48 is of the inductive type if the length L thereof is less than the quarter of the wavelength of the working frequency of the radiofrequency unit 40 and if the second end 48b of the first adaptation line section 48 is electrically connected to the reference voltage 26. Furthermore, the first adaptation line section 48 is of the capacitive type if the length thereof is greater than the quarter of the wavelength of the working frequency of the radiofrequency unit 40 and the second end 48b of the first adaptation line section 48 is electrically connected to the reference voltage 26.

Advantageously, the first adaptation line section 48 is of the capacitive type if the length L thereof is less than the quarter of the wavelength of the working frequency of the radiofrequency unit 40 and if the second end 48b of the first adaptation line section 48 is devoid of an electrical connection. Furthermore, the first adaptation line section 48 is of the inductive type if the length thereof is greater than the quarter of the wavelength of the working frequency of the radiofrequency unit 40 and if the second end 48b of the first adaptation line section 48 is devoid of an electrical connection.

The length L of the first adaptation line section 48 is dependent on the working frequency of the radiofrequency unit 40.

The length L of the first adaptation line section 48 can also be dependent on the type of substrate forming the printed circuit board 47, as well as the relative permittivity to air of the substrate forming the printed circuit board 47.

In a case where the characteristic impedance value of the first adaptation line section 48 is of the order of 50 Ohms and the working frequency of the radiofrequency unit 40 is of the order of 2.45 GHz, the length L of the first adaptation line section 48 is of the order of 30 millimeters.

In another case where the characteristic impedance value of the first adaptation line section 48 is of the order of 50 Ohms and the working frequency of the radiofrequency unit 40 is of the order of 868 MHz, the length L of the first adaptation line section 48 is of the order of 86 millimeters.

The frequency for receiving and/or emitting radio signals can be different and can be in the range of 400 MHz to 6 GHz, and can be, especially, in the order of 433 MHz.

As a non-limiting example, the substrate of the printed circuit board 47 is made of epoxy and is, in particular, of the FR4 type. And the relative permittivity to air of the substrate of the printed circuit board 47 is 4,3.

Advantageously, the first electrical conductor 42 of the power supply cable 18, electrically connected to the first electrical conductor 38 of the radiofrequency signal control device 37, is a neutral electrical conductor. Furthermore, the second electrical conductor 43 of the power supply cable 18, electrically connected to the second electrical conductor 39 of the radiofrequency signal control device 37, is a phase electrical conductor.

In a variant, the first electrical conductor 42 of the power supply cable 18, electrically connected to the first electrical conductor 38 of the radiofrequency signal control device 37, is a phase electrical conductor. Furthermore, the second electrical conductor 43 of the power supply cable 18, electrically connected to the second electrical conductor 39 of the radiofrequency signal control device 37, is a neutral electrical conductor.

Advantageously, the printed circuit board 47 comprises the electrical track embodying the first adaptation line section 48 at a first layer thereof and a ground plane made at a second layer thereof. The first layer is different from the second layer. The ground plane is the reference voltage 26.

Advantageously, the first adaptation line section 48 can comprise a bend, so as to be "L"-shaped, as illustrated in FIG. 4, several bends, so as to be inverted "U" shaped, or be devoid of bend, so as to be "I" shaped, in other words so as to extend in a straight line.

Advantageously, in the case where the first adaptation line section 48 comprises one or more bends, the length L corresponds to the sum of the lengths of the branches of the first adaptation line section 48.

Here and as illustrated in FIG. 4, the length L of the first adaptation line section 48 corresponds to the sum of the lengths L1, L2 of the two branches of the first adaptation line section 48, as it comprises a bend.

Furthermore, in the case where the first adaptation line section 48 is devoid of bend, in other words straight, the length L corresponds to the length of the single branch of the first adaptation line section 48.

Advantageously, the radiofrequency signal control device 37 further comprises another adaptation line section 50 and another connection point 52.

Here, the other adaptation line section 50 is hereinafter referred to as second adaptation line section. Furthermore, the other connection point 52 is hereinafter referred to as second connection point.

The second connection point 52 is arranged at the second end 39b of the second electrical conductor 39.

The second adaptation line section 50 comprises a first end 50a and a second end 50b. The first end 50a is distinct from and, in particular, opposite the second end 50b. The first end 50a of the second adaptation line section 50 is electrically connected to the second connection point 52.

Here, the second end 50b of the adaptation line section 50 is electrically connected to the reference voltage 26.

In a variant, not shown, the second end 50b of the second adaptation line section 50 is devoid of an electrical connection, in particular to an element of the radiofrequency signal control device 37.

Advantageously, the second adaptation line section 50 has the same characteristics, in particular physical and geometric, as the first adaptation line section 48 described above.

Thus, what applies to the first adaptation line section 48 can also apply to the second adaptation line section 50.

Therefore, the second adaptation line section 50 is configured not to be traversed, in other words is not traversed, by the current of the mains electrical supply network circulating in one of the electrical conductors of the mains electrical supply network 24, in the second electrical conductor 43 of the power supply cable 18, then in the second electrical conductor 39 of the radiofrequency signal control device 37.

In this way, the dimensions of the second adaptation line section 50 can be minimised, as well as those of the printed circuit board 47.

Moreover, the second adaptation line section 50 is configured not to be traversed, in other words is not traversed, by the radiofrequency signals circulating in one of the electrical conductors of the mains electrical supply network 24, in the second electrical conductor 43 of the power supply cable 18, then in the second electrical conductor 39 of the radiofrequency signal control device 37.

Advantageously, the dimensions of the second adaptation line section 50 are small, in the case where the working frequency of the radiofrequency unit 40 is higher than 1 GHz, for example of the order of 2.4 GHz.

Advantageously, the first and second adaptation line sections 48, 50 can be of identical length L.

In a variant, the first and second adaptation line sections 48, 50 can be of different lengths L, so as to adapt the impedance on the first electrical conductor 38 to the impedance of the antenna 25.

Furthermore, the second adaptation line section 50 allows the second electrical conductor 39 of the radiofrequency signal control device 37 to be insulated from a radiofrequency point of view, so as not to disturb the operation of the antenna 25 made by means of the first electrical conductor 42 of the power supply cable 18 and at least one of the electrical conductors of the mains electrical supply network 24.

The second end 48b of the first adaptation line section 48 and the second end 50b of the second adaptation line section 50 can be electrically connected to a same reference voltage 26.

In such a case, the reference voltage 26 can be obtained from a same ground plane of the printed circuit board 47.

In a variant, not shown, each of the second ends 48b, 50b of the first adaptation line section 48 and the second adaptation line section 50 can be electrically connected to a different reference voltage.

Advantageously, the radiofrequency signal control device 37 further comprises at least one insulation element 54.

Here, the insulation element 54 is hereinafter referred to as first insulation element.

The first insulation element 54 is electrically connected, on the one hand, to the second connection point 52 and, on the other hand, to the reference voltage 26.

Thus, the first insulation element 54 provides a high impedance at the second electrical conductor 39 of the radiofrequency signal control device 37 for a predetermined working frequency of the radiofrequency unit 40.

Furthermore, the first insulation element 54 allows the second electrical conductor 43 of the power supply cable 18 and the second electrical conductor 39 of the radiofrequency signal control device 37 to be insulated, from a radiofrequency point of view, with respect to the reference voltage 26, so as not to disturb the operation of the antenna 25 made by means of the first electrical conductor 42 of the power supply cable 18 and at least one of the electrical conductors of the mains electrical supply network 24.

Here, the first insulation element 54 is only a capacitor.

In a variant, not shown, the first insulation element 54 is an anti-resonant circuit, which can also be referred to as "plug circuit". Furthermore, the anti-resonant circuit comprises a capacitor and a resistor.

Advantageously, in this case, the capacitor and the resistor can be connected in series or in parallel.

Advantageously, the radiofrequency signal control device 37 comprises another insulation element 55.

Here, the other insulation element 55 is hereinafter referred to as second insulation element.

The second insulation element 55 is electrically connected, on the one hand, to the second end 50b of the second adaptation line section 50 and, on the other hand, to the reference voltage 26.

Thus, the second insulation element 55 allows the second electrical conductor 43 of the power supply cable 18 and the second electrical conductor 39 of the radiofrequency signal control device 37 to be insulated, from a radiofrequency point of view, with respect to the reference voltage 26, so as not to disturb the operation of the antenna 25 made by means of the first electrical conductor 42 of the power supply cable 18 and at least one of the electrical conductors of the mains electrical supply network 24.

Here, the second insulation element 55 is only a capacitor.

In this first embodiment shown in FIG. 4, the second end 48b of the first adaptation line section 48 is electrically connected directly to the reference voltage 26, in other words without the interposition of an electronic component such as, for example, a capacitor which would form an insulation element. This direct electrical connection between the second end 48b of the first adaptation line section 48 and the reference voltage 26 is due to the fact that the first adaptation line section 48 is electrically connected to the first electrical conductor 38 of the radiofrequency signal control device 37, which is itself electrically connected to the first electrical conductor 42 of the power supply cable 18, which are neutral electrical conductors, as previously explained. Furthermore, the second end 50b of the second adaptation line section 50 is electrically connected to the reference voltage 26 by the second insulation element 55. This electrical connection between the second end 50b of the second adaptation line section 50 and the reference voltage 26 by the second electrical insulation element 55 is due to the fact that the second adaptation line section 50 is electrically connected to the second electrical conductor 39 of the radiofrequency signal control device 37, which is itself electrically connected to the second electrical conductor 43 of the power supply cable 18, which are phase electrical conductors, as previously explained.

In a variant, in the case where the phase and neutral electrical conductors are reversed, the second end 48b of the first adaptation line section 48 is electrically connected to the reference voltage 26 by an insulation element. Furthermore, the second end 50b of the second adaptation line section 50 is electrically connected directly to the reference voltage 26.

Figure 5:
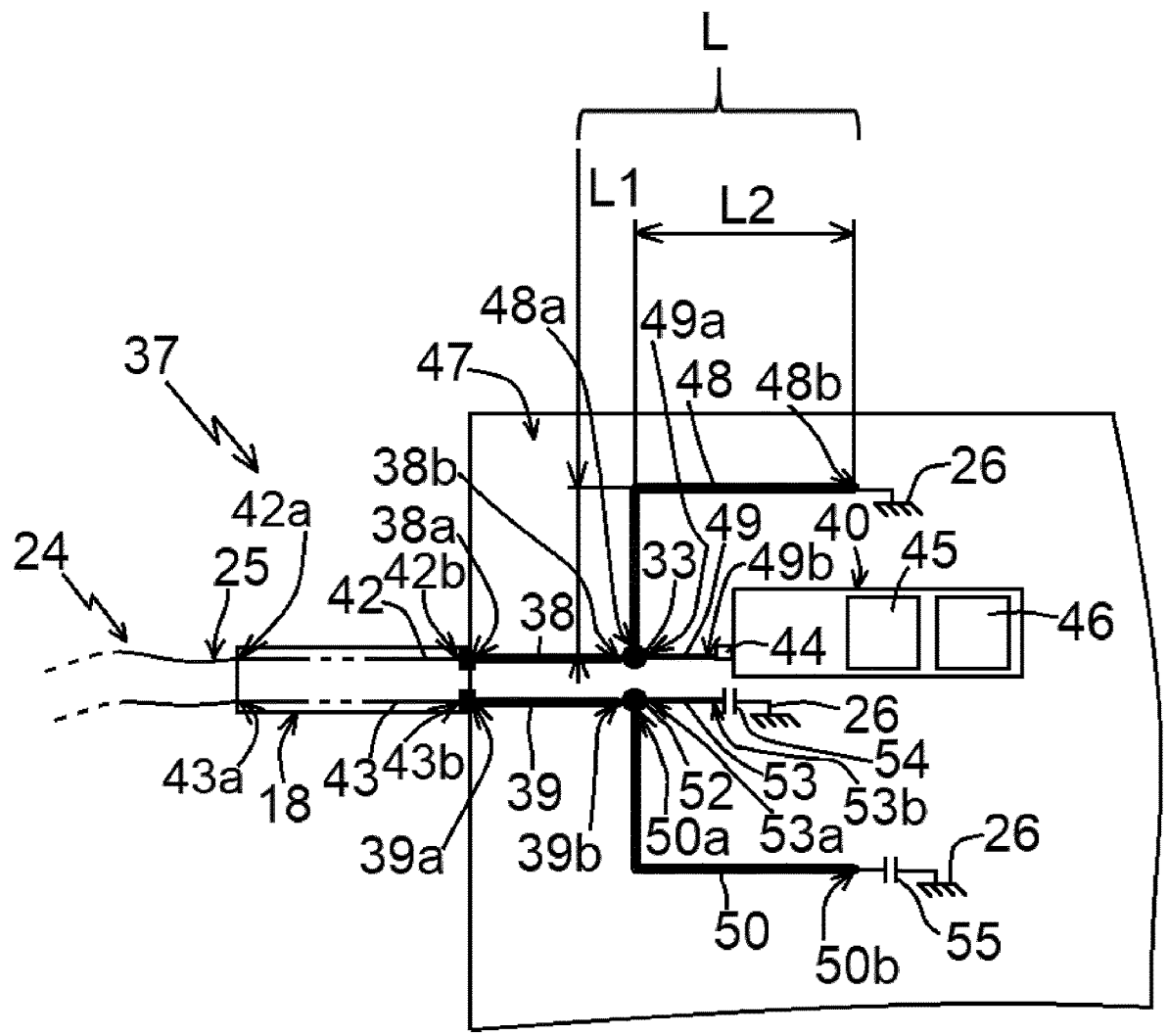
FIG. 5 is a simplified electrical diagram of a radiofrequency signal control device of a domestic electrical apparatus, according to a second embodiment of the invention.

In the second embodiment, shown in FIG. 5, the elements similar to those of the first embodiment have the same references and operate as explained above. In the following, mainly the differences between this second embodiment and the previous one are described. In the following, where a reference sign is used without being reproduced in FIG. 5, it corresponds to the object bearing the same reference in one of FIGS. 1 to 4.

The radiofrequency signal control device 37 according to the second embodiment of the invention is now described with reference to FIG. 5.

The radiofrequency signal control device 37 further comprises at least one radiofrequency signal transport line 49.

Here, the transport line 49 is hereinafter referred to as first transport line 49.

The first transport line 49 is configured to emit the radiofrequency signals. However, this first transport line is not configured to adapt the output and/or input impedance of the radiofrequency unit 40 to the impedance of the antenna 25.

The first transport line 49 comprises a first end 49a and a second end 49b. The first end 49a is distinct from and, in particular, opposite the second end 49b. The first end 49a of the first transport line 49 is electrically connected to the first electrical conductor 38 of the radiofrequency signal control device 37. Furthermore, the second end 49b of the first transport line 49 is electrically connected to the radiofrequency unit 40, in particular to the input and/or output 44 of the radiofrequency unit 40.

Advantageously, the first end 49a of the first transport line 49 is electrically connected to the first connection point 33. The connection point 33 is configured to be electrically connected to the radiofrequency unit 40.

Advantageously, the printed circuit board 47 carries, in other words comprises, the first transport line 49. Furthermore, the first transport line 49 is formed by an electrical track printed on the printed circuit board 47.

Thus, the first transport line 49 is an electrical track on the printed circuit board 47.

Advantageously, the first transport line 49 is configured to be traversed, in other words is traversed, by the current of the mains electrical supply network 24 circulating in one of the electrical conductors of the mains electrical supply network 24, in the first electrical conductor 42 of the power supply cable 18, then in the first electrical conductor 38 of the radiofrequency signal control device 37.

Advantageously, the radiofrequency signal control device 37 comprises another transport line 53.

Here, the other transport line 53 is hereinafter referred to as second transport line.

The second transport line 53 comprises a first end 53a and a second end 53b. The first end 53a is distinct from and, in particular, opposite the second end 53b. The first end 53a of the second transport line 53 is electrically connected to the second electrical conductor 39 of the radiofrequency signal control device 37. Furthermore, the second end 53b of the second transport line 53 is electrically to the reference voltage 26.

Advantageously, the first end 53a of the second transport line 53 is electrically connected to the first connection point 52.

Advantageously, the second transport line 53 has the same characteristics as the first transport line 49 described above.

Thus, what applies to the first transport line 49 can also apply to the second transport line 53.

Furthermore, the second transport line 53 allows the second electrical conductor 39 of the radiofrequency signal control device 37 to be insulated from a radiofrequency point of view, so as not to disturb the operation of the antenna 25 made by means of the first electrical conductor 42 of the power supply cable 18 and at least one of the electrical conductors of the mains electrical supply network 24.

Moreover, the second transport line 53 is configured not to absorb, in other words does not absorb, at least part of the radiofrequency energy of the radiofrequency signals circulating in the first transport line 49, as this second transport line 53 is intended to have, in other words has, a high impedance.

The second end 53b of the second transport line 53 can be electrically connected to a same reference voltage 26 as the second end 48b of the first adaptation line section 48 and the second end 50b of the second adaptation line section 50.

In such a case, the reference voltage 26 can be obtained from a same ground plane of the printed circuit board 47.

In a variant, not shown, one or more or each of the second ends 48b, 50b, 53b of the first adaptation line section 48, the second adaptation line section 50 and the second transport line 53 can be electrically connected to a different reference voltage.

Advantageously, the second transport line 53 is configured to be traversed, in other words is traversed, by the current of the mains electrical supply network 24 circulating in one of the electrical conductors of the mains electrical supply network 24, in the second electrical conductor 43 of the power supply cable 18, then in the second electrical conductor 39 of the radiofrequency signal control device 37.

Furthermore, the current of the mains electrical supply network 24 is configured to supply, in other words supplies, to the electromechanical actuator 11 and, in particular, to the electric motor 16 of the electromechanical actuator 11 and the electronic control unit 15.

Figure 6:
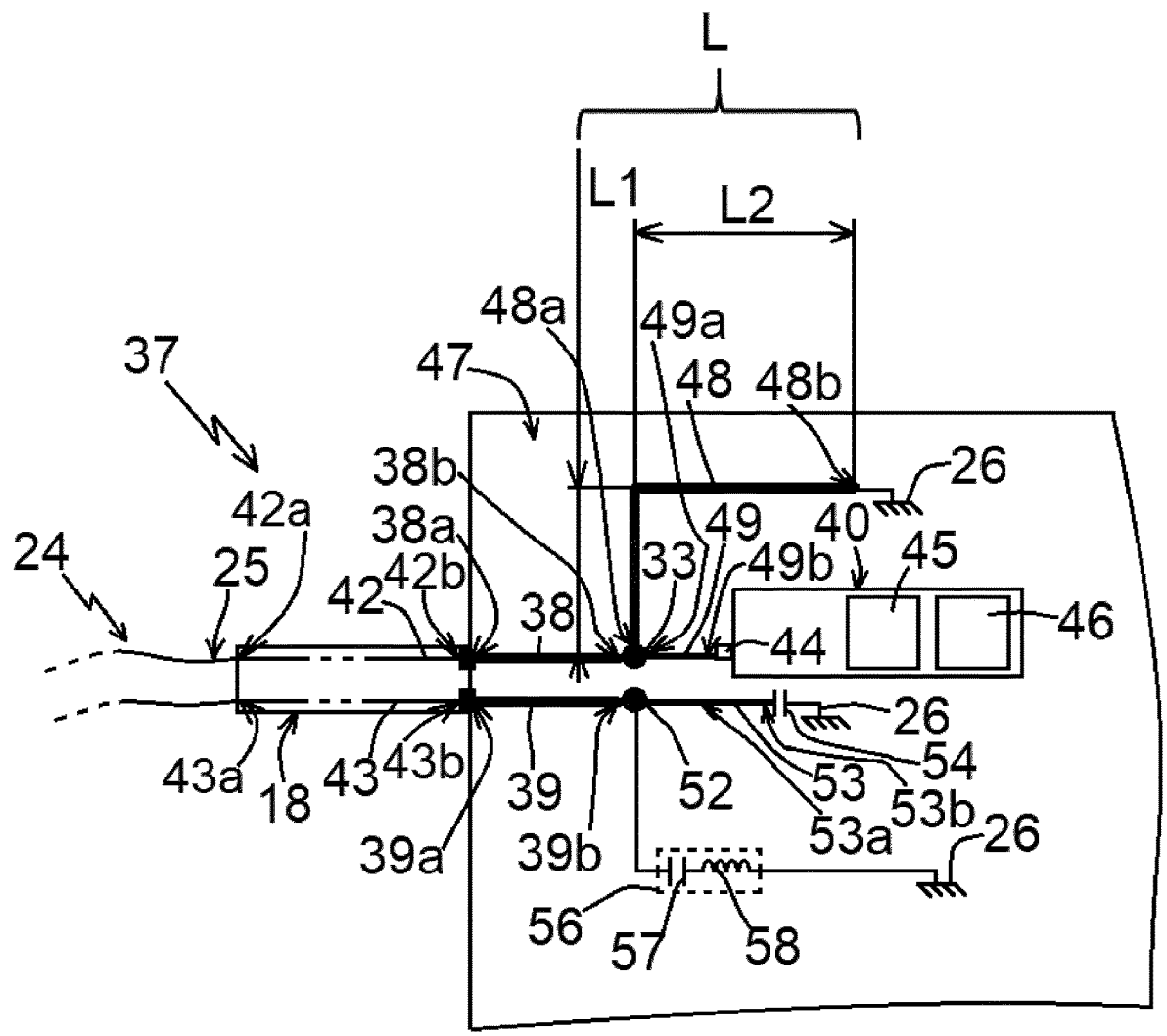
FIG. 6 is a simplified electrical diagram of a radiofrequency signal control device of a domestic electrical apparatus, according to a third embodiment of the invention.
Figure 7:
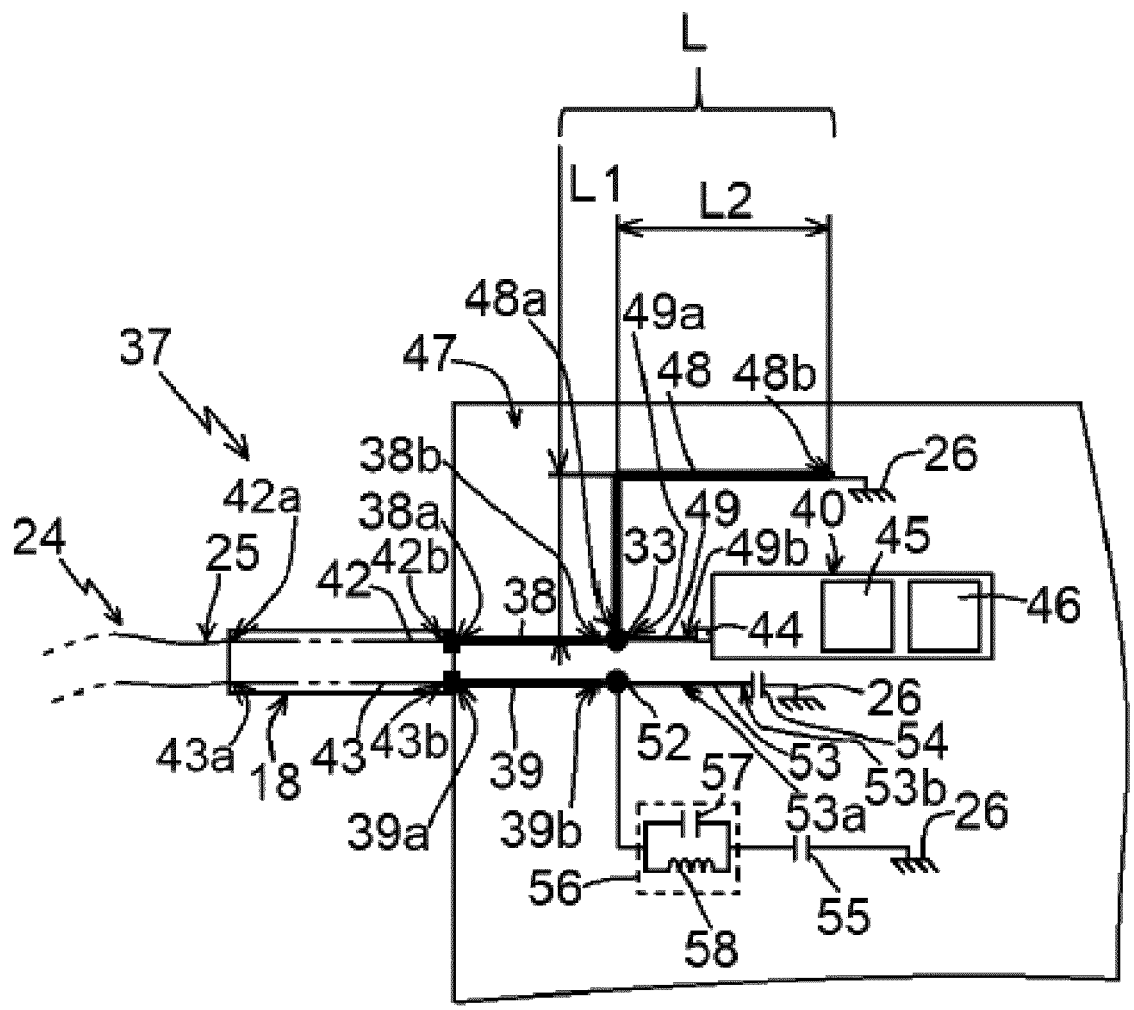
FIG. 7 is a simplified electrical diagram of a radiofrequency signal control device of a domestic electrical apparatus, according to a fourth embodiment of the invention.

In the third and fourth embodiments of the invention, shown respectively in FIGS. 6 and 7, the elements similar to those of the first or second embodiment have the same references and operate as explained above. In the following, mainly the differences between these third and fourth embodiments and the previous one are described. In the following, where a reference sign is used without being reproduced in FIG. 6 or FIG. 7, it corresponds to the object bearing the same reference in one of FIGS. 1 to 5.

The radiofrequency signal control device 37 according to the third embodiment of the invention is now described with reference to FIG. 6.

The radiofrequency signal control device 37 further comprises an adaptation circuit 56, replacing the second adaptation line section 50. Furthermore, the adaptation circuit 56 is electrically connected to the second connection point 52, arranged at the second end 39b of the second electrical conductor 39.

Advantageously, the adaptation circuit 56 comprises at least a capacitor 57 and an inductance 58. The capacitor 57 and the inductance 58 are electrically connected in series.

Here, the connection point 52 is electrically connected to the capacitor 57 and the capacitor 57 is electrically connected to the inductance 58.

In a variant, not shown, the connection point 52 is electrically connected to the inductance 58 and the inductance 58 is electrically connected to the capacitor 57.

Furthermore, the adaptation circuit 56 is electrically connected to the reference voltage 26.

The second end 48b of the first adaptation line section 48 and the adaptation circuit 56 can be electrically connected to a same reference voltage 26.

In such a case, the reference voltage 26 can be obtained from a same ground plane of the printed circuit board 47.

In a variant, not shown, the second end 48b of the first adaptation line section 48 and the adaptation circuit 56 can be electrically connected to different reference voltages.

In a variant, not shown, the adaptation circuit 56 is electrically connected to the first electrical conductor 38 of the radiofrequency signal control device 37, which is itself electrically connected to the first electrical conductor 42 of the power supply cable 18, the electrical conductors 38 and 42 being neutral electrical conductors, as previously explained. In this case, the second electrical conductor 39 of the radiofrequency signal control device 37 is itself electrically connected to the second electrical conductor 43 of the power supply cable 18, the electrical conductors 39 and 43 being phase electrical conductors, as previously explained.

Furthermore, in this case, the capacitor 57 of the adaptation circuit 56 is formed by a single electronic component used, on the one hand, as an adaptation capacitor and, on the other hand, as an electrical insulation capacitor or is composed of a first electronic adaptation component, in particular an adaptation capacitor, and a second electronic component for electrical insulation, in particular an electrical insulation capacitor. Thus, the capacitor 57 makes it possible, on the one hand, to prevent an electrical short-circuit between the first and second electrical conductors 38, 39 of the radiofrequency signal control device 37 and, on the other hand, to ensure an adaptation from a radiofrequency point of view of the radiofrequency signal control device 37.

In another variant, not shown, where the phase and neutral electrical conductors are reversed, the adaptation circuit 56 is electrically connected to the first electrical conductor 38 of the radiofrequency signal control device 37, which is itself electrically connected to the first electrical conductor 42 of the power supply cable 18, the electrical conductors 38 and 42 being phase electrical conductors. In this case, the second electrical conductor 39 of the radiofrequency signal control device 37 is itself electrically connected to the second electrical conductor 43 of the power supply cable 18, the electrical conductors 39 and 43 being neutral electrical conductors. Furthermore, in this case, the capacitor 57 of the adaptation circuit 56 has the same operating characteristics as described above, in the case where the first electrical conductor 38 of the radiofrequency signal control device 37 and the first electrical conductor 42 of the power supply cable 18 are neutral electrical conductors.

The adaptation circuit 56 is configured not to be traversed, in other words is not traversed, by the current of the mains electrical supply network circulating in one of the electrical conductors of the mains electrical supply network 24, in the second electrical conductor 43 of the power supply cable 18, then in the second electrical conductor 39 of the radiofrequency signal control device 37.

In this way, the dimensions of the adaptation circuit 56 can be minimised, as well as those of the printed circuit board 47.

Moreover, the adaptation circuit 56 is configured not to be traversed, in other words is not traversed, by the radiofrequency signals circulating in one of the electrical conductors of the mains electrical supply network 24, in the second electrical conductor 43 of the power supply cable 18, then in the second electrical conductor 39 of the radiofrequency signal control device 37.

Advantageously, the dimensions of the adaptation circuit 56 are small, being able to be defined, for example, by a surface, in particular of square shape, having a side whose length is less than or equal to five millimetres or by a surface, of rectangular shape, having a length less than or equal to one millimetre and a width less than or equal to half a millimetre. This applies in particular to the dimensions of the inductance 58, where the working frequency of the radiofrequency unit 40 is higher than 1 GHz, for example of the order of 2.4 GHz.

Furthermore, the adaptation circuit 56 allows the second electrical conductor 39 of the radiofrequency signal control device 37 to be insulated from a radiofrequency point of view, so as not to disturb the operation of the antenna 25 made by means of the first electrical conductor 42 of the power supply cable 18 and at least one of the electrical conductors of the mains electrical supply network 24.

Advantageously, the radiofrequency signal control device 37 can further comprise the insulation element 54, as described above.

However, the radiofrequency signal control device 37 is devoid of the second insulation element 55 of the first and second embodiments. This second insulation element 55 is replaced by the capacitor 57 of the adaptation circuit 56, in particular either when this is used as an electrical insulation capacitor, or by the second electronic component for electrical insulation constituting part of the capacitor 57 of the adaptation circuit 56, as previously described.

Advantageously, the radiofrequency signal control device 37 can further comprise the first transport line 49 and/or the second transport line 53, as previously described with reference to the second embodiment, or be devoid thereof, as previously described with reference to the first embodiment.

The radiofrequency signal control device 37 according to the fourth embodiment of the invention is now described with reference to FIG. 7.

Here, the capacitor 57 and the inductance 58 of the adaptation circuit 56 are electrically connected in parallel.

In this case, the adaptation circuit 56 has broadly the same operating characteristics as described above, in the case where the capacitor 57 and the inductance 58 of the adaptation circuit 56 are electrically connected in series.

Here, the connection point 52 is electrically connected, on the one hand, to the capacitor 57 and, on the other hand, to the inductance 58.

Furthermore, the adaptation circuit 56 is electrically connected to the second electrical insulation element 55, as described with reference to the first and second embodiments.

Here, the capacitor 57 and the inductance 58 are respectively connected to the second electrical insulation element 55.

As in the third embodiment, the second end 48b of the first adaptation line section 48 and the second electrical insulation element 55 can be electrically connected to a same reference voltage 26 or to different reference voltages.

In a variant, not shown, the adaptation circuit 56 is electrically connected to the first electrical conductor 38 of the radiofrequency signal control device 37, which is itself electrically connected to the first electrical conductor 42 of the power supply cable 18, the electrical conductors 38 and 42 being neutral electrical conductors, as previously explained. In this case, the second electrical conductor 39 of the radiofrequency signal control device 37 is itself electrically connected to the second electrical conductor 43 of the power supply cable 18, the electrical conductors 39 and 43 being phase electrical conductors, as previously explained. Furthermore, in this case, the second insulation element 55, on the one hand, prevents an electrical short-circuit between the first and second electrical conductors 38, 39 of the radiofrequency signal control device 37 and the adaptation circuit 56, which is formed by the capacitor 57 and the inductance 58 of the adaptation circuit 56 which are electrically connected in parallel, and, on the other hand, ensures adaptation from a radiofrequency point of view of the radiofrequency signal control device 37.

In another variant, not shown, where the phase and neutral electrical conductors are reversed, the adaptation circuit 56 is electrically connected to the first electrical conductor 38 of the radiofrequency signal control device 37, which is itself electrically connected to the first electrical conductor 42 of the power supply cable 18, the electrical conductors 38 and 42 being phase electrical conductors. In this case, the second electrical conductor 39 of the radiofrequency signal control device 37 is itself electrically connected to the second electrical conductor 43 of the power supply cable 18, the electrical conductors 39 and 43 being neutral electrical conductors. Furthermore, in this case, the second electrical insulation element 55 and the adaptation circuit 56 have the same operating characteristics as described above, in the case where the first electrical conductor 38 of the radiofrequency signal control device 37 and the first electrical conductor 42 of the power supply cable 18 are neutral electrical conductors.

In reading what has been described previously, a domestic electrical apparatus, in particular the electromechanical actuator 11 for the occultation device 3, can comprise a radiofrequency signal control device 37.

An installation can be configured by comprising several domestic electrical apparatuses, especially several electromechanical actuators 11, as previously described and, eventually, several local or central command units 12, 13, and/or several sensors which can be configured to communicate together on a common radiofrequency network, using a common protocol and identification means.

Thanks to the present invention, regardless of the embodiment, the first adaptation line section electrically connected to the first connection point arranged at the second end of the first electrical conductor allows to adapt an impedance on the first electrical conductor to an impedance of the antenna, to prevent rejection of the radiofrequency signals between the first and second electrical conductors of the radiofrequency signal control device, to reduce radiofrequency losses, in terms of power and sensitivity, when receiving and/or emitting the radiofrequency signals by the radiofrequency signal control device, while reducing the dimensions of the printed circuit board.

Of course, many modifications can be made to the previously described embodiments without departing from the scope of the invention defined by the attached claims.

In a variant, not shown, the radiofrequency signal control device 37 is devoid of, in other words does not comprise, the first electrical conductor 38 and the second electrical conductor 39. In such a case, the first connection point 33 is electrically connected directly to the first electrical conductor 42 of the power supply cable 18, in particular by means of an electrical connector mounted on the printed circuit board 47, at the second end 42b of the first electrical conductor 42 of the power supply cable 18. Furthermore, the second connection point 52 is electrically connected directly to the second electrical conductor 43 of the power supply cable 18, in particular by means of an electrical connector mounted on the printed circuit board 47, at the second end 43b of the second electrical conductor 43 of the power supply cable 18. Thus, in this case, the first and second electrical conductors 38, 39 are replaced by the first and second electrical conductors 42, 43 of the power supply cable 18. In other words, the first electrical conductor 38 and the first electrical conductor 42 form a single first electrical conductor. Similarly, the second electrical conductor 39 and the second electrical conductor 43 form a single second electrical conductor.

In a variant, not shown, the power supply cable 18 can comprise at least three electrical conductors, including two phases and one neutral. In such a case, one end of each electrical conductor of the power supply cable 18 is configured to be electrically connected, in other words is electrically connected, to a first end of one of the electrical conductors of the radiofrequency signal control device 37, in particular one of the electrical tracks of the printed circuit board 47. Furthermore, a second end of each electrical conductor of the radiofrequency signal control device 37 is electrically connected to a separate connection point, as previously described.

The invention is shown in FIGS. 4 and 5 in the case where the domestic electrical apparatus controlled by the radiofrequency signal control device 37 is the electromechanical actuator 11 of the installation 100 of FIGS. 1 to 3. However, this is not mandatory. In a variant, this electrical domestic apparatus can be a lighting device, a ventilation and/or heating device, especially an infrared terrace heating device, or an alarm device fitted to a building or its external environment, such as the garden. The domestic electrical apparatus comprising the radiofrequency signal control device can also be a sensor for detecting a weather parameter, such as sunshine, wind or humidity, a presence sensor or an alarm sensor. The domestic electrical apparatus comprising the radiofrequency signal control device can also be an electrical power supply module intended to be housed within an electrical wall or ceiling box and configured to supply power to a lighting device, a heating and/or ventilation device, an alarm device or an occultation device.

The invention is shown in FIGS. 4 and 5 in the case where the radiofrequency signal control device 37 is partially included in the electronic control unit 15 of the electromechanical actuator 11, in particular in the first communication module 27. However, this is not mandatory. In a variant, the radiofrequency signal control device 37 can be part of an electronic control unit distinct from the electronic control unit 15 and/or can be arranged outside the casing 17 of the electromechanical actuator 11 and, in particular, mounted on the box 9 or in the torque support 21.

Furthermore, the envisaged embodiments and variants may be combined to generate new embodiments of the invention, without departing from the scope of the invention defined by the attached claims.

The invention claimed is:

1. A radiofrequency signal control device of a domestic electrical apparatus, the domestic electrical apparatus being configured to be supplied with electrical energy from a mains electrical supply network, the radiofrequency signal control device comprising:
   a first electrical conductor and a second electrical conductor, each of the first and second electrical conductors comprising a first end and a second end, the first end of each of the first and second electrical conductors being configured to be electrically connected to the mains electrical supply network,
   a radiofrequency unit, the radiofrequency unit being configured to receive or emit, or receive and emit radiofrequency signals, the radiofrequency unit comprising an input or an output, or an input and an output for the radiofrequency signals, the radiofrequency unit being electrically connected to a connection point,
   a printed circuit board, the printed circuit board comprising at least the connection point, and
   an antenna, the antenna being electrically connected to the radiofrequency unit by at least one of the electrical conductors of the mains electrical supply network;
   wherein
   the connection point is arranged at the second end of the first electrical conductor, and
   the radiofrequency signal control device further comprises at least one adaptation line section, the adaptation line section comprising a first end and a second end, the first end of the adaptation line section being electrically connected to the connection point and the second end of the adaptation line section being either electrically connected to a reference voltage or is devoid of an electrical connection.

2. The radiofrequency signal control device according to claim 1, wherein the first adaptation line section is an electrical track of the printed circuit board.

3. The radiofrequency signal control device according to claim 1, wherein the adaptation line section has a length close to a quarter of the wavelength of a working frequency of the radiofrequency unit.

4. The radiofrequency signal control device according to claim 1, wherein
   the radiofrequency signal control device further comprises another adaptation line section and another connection point,
   the other connection point is arranged at the second end of the second electrical conductor,
   the other adaptation line section comprises a first end and a second end,
   the first end of the other adaptation line section is electrically connected to the other connection point, and
   the second end of the other adaptation line section either is devoid of an electrical connection or is electrically connected to the reference voltage or another reference voltage.

5. The radiofrequency signal control device according to claim 1, wherein
   the radiofrequency signal control device further comprises an adaptation line section and another connection point,
   the other connection point is arranged at the second end of the second electrical conductor, and
   the adaptation circuit is electrically connected, on one hand, to the other connection point and, on the other hand, is either electrically connected to the reference voltage, to another reference voltage or to the first electrical conductor.

6. The radiofrequency signal control device according to claim 1, wherein
   that the radiofrequency signal control device further comprises at least one radiofrequency signal transport line,
   the transport line comprises a first end and a second end,
   the first end of the transport line is electrically connected to the first electrical conductor and,
   the second end of the transport line is electrically connected to the radiofrequency unit.

7. The radiofrequency signal control device according to claim 6, wherein the first end of the transport line is electrically connected to the connection point, the connection point being configured to be electrically connected to the radiofrequency unit.

8. The radiofrequency signal control device according to claim 6, wherein
   the printed circuit board carries the transport line, and
   the transport line is formed by an electrical track printed on the printed circuit board.

9. The radiofrequency signal control device according to claim 1, wherein the radiofrequency signal control device is devoid of a coupler arranged between the first electrical conductor and the radiofrequency unit.

10. A domestic electrical apparatus, wherein the domestic electrical apparatus comprises at least one radiofrequency signal control device according to claim 1.

11. The domestic electrical apparatus according to claim 10, wherein the domestic electrical apparatus is an electromechanical actuator for an occultation device.

12. The domestic electrical apparatus according to claim 10, wherein the domestic electrical apparatus is an electrical power supply module, the electrical power supply module being intended to be housed within an electrical wall or ceiling box and being configured to supply electrical energy to a lighting device, a heating device, a ventilation device, a heating and ventilation device, an alarm device or an occultation device.

13. An occultation device, wherein the occultation device comprises at least an electromechanical actuator formed by the domestic electrical apparatus according to claim 10.

\* \* \* \* \*

UNITED STATES PATENT AND TRADEMARK OFFICE
CERTIFICATE OF CORRECTION

PATENT NO. : 11,837,780 B2
APPLICATION NO. : 18/245912
DATED : December 5, 2023
INVENTOR(S) : Serge Robin It is certified that error appears in the above-identified patent and that said Letters Patent is hereby corrected as shown below:

In the Claims

Column 24, Line 37, Claim 6, "that the radiofrequency signal" should read --the radiofrequency signal--

Column 24, Line 41, Claim 6, "the first electrical conductor and," should read --the first electrical conductor, and--

Signed and Sealed this
Ninth Day of April, 2024

*Katherine Kelly Vidal*

Katherine Kelly Vidal
*Director of the United States Patent and Trademark Office*